(12) United States Patent  
Johansson (10) Patent No.: US 7,999,443 B2
(45) Date of Patent: Aug. 16, 2011

(54) ELECTROMECHANICAL ACTUATORS AND MANUFACTURING METHOD THEREOF

(75) Inventor: Stefan Johansson, Uppsala (SE)

(73) Assignee: PiezoMotor Uppsala AB, Uppsala (SE)

( * ) Notice: Subject to any disclaimer, the term of this patent is extended or adjusted under 35 U.S.C. 154(b) by 156 days.

(21) Appl. No.: 12/177,399

(22) Filed: Jul. 22, 2008

(65) Prior Publication Data

US 2010/0019622 A1    Jan. 28, 2010

(51) Int. Cl.
*H01L 41/08*    (2006.01)
(52) U.S. Cl. ............ 310/332; 310/331; 310/323.02
(58) Field of Classification Search .......... 310/332, 310/366, 328
See application file for complete search history.

(56) References Cited

U.S. PATENT DOCUMENTS

| | | | | |
|---|---|---|---|---|
| 3,378,704 A | * | 4/1968 | Smith et al. .............. | 310/366 |
| 4,742,264 A | * | 5/1988 | Ogawa .................. | 310/332 |
| 5,693,998 A | * | 12/1997 | Fujimoto et al. .......... | 310/366 |
| 6,337,532 B1 | * | 1/2002 | Johansson et al. ...... | 310/323.02 |
| 6,798,117 B2 | * | 9/2004 | Johansson et al. ...... | 310/323.02 |
| 6,933,662 B2 | * | 8/2005 | Arbogast et al. .......... | 310/366 |

* cited by examiner

*Primary Examiner* — Mark Budd
(74) *Attorney, Agent, or Firm* — Young & Thompson (57) ABSTRACT

An electromechanical actuator comprises a bimorph element (10) of an electromechanical material. The bimorph element (10) is controllably bendable in a first direction (15) by application of three voltage potentials to electrodes (41, 42, 43) of the bimorph element (10). The electromechanical actuator further comprises three conductive film areas (55, 56, 57) provided at a first side (51) of the bimorph element (10), which first side (51) is parallel to the first direction (15). The three conductive film areas (55, 56, 57) are electrically decoupled from each other. Furthermore, each of the three conductive film areas (55, 56, 57) is connected to at least one respective one of the electrodes (41, 42, 43). A method for manufacturing such an electromechanical actuator is also disclosed.

7 Claims, 10 Drawing Sheets

ELECTROMECHANICAL ACTUATORS AND MANUFACTURING METHOD THEREOF

TECHNICAL FIELD

The present invention relates in general to electromechanical actuators and manufacturing methods thereof and in particular to the provision of arrangements for electrical contacting of such electromechanical actuators.

BACKGROUND

Electromechanical actuators are today used for a large variety of applications. The use of bimorph element has been very attractive due to its ability to provide motion in two dimensions. Such motion patterns are particularly suitable for different motor applications. A typical way to build the bimorph elements is to use multilayer techniques with a large number of internal electrodes. Typical examples of such actuators, based on piezoelectric materials, are to be found e.g. in the U.S. Pat. Nos. 6,337,532, 6,798,117, 7,335,325 and the published international patent application WO2007/099043.

In order to activate a multilayer bimorph, the internal electrodes have to be provided with suitable voltages. A common way to arrange for this is to let the internal electrodes reach the surface of the bimorph and provide a termination stripe at the surface of the bimorph. In the embodiments illustrated in the above mentioned documents, terminations of internal phase electrodes are provided at one side of the bimorph, whereas terminations of internal ground electrodes are provided at the opposite side. Suitable voltage sources are then electrically connected to the different terminations. In such a way) the internal electrodes are supplied with suitable voltages for creating electrical fields within the piezoelectric material, which in turn causes the piezoelectric material to present changes in geometrical dimensions.

In many applications, the actuators have to be very small, and the small size generally makes electrical connections more difficult to realize, at least in a manner which is suitable for industrial production. The terminations have typically to be provided by two consecutive manufacturing steps, one for each side of the actuator and provision of electrical connection typically has to involve a turning of the tiny actuators. High demands on geometrical precision and accuracy render relatively high production costs.

SUMMARY

An object of the present invention is to provide electromechanical actuators and manufacturing methods allowing less expensive and/or more reliable arrangements for connecting the internal electrodes.

The above object is achieved by devices and methods according to the enclosed patent claims. In general words, in a first aspect, an electromechanical actuator comprises a bimorph element of an electromechanical material. The bimorph element is controllably bendable in a first direction by application of three voltage potentials to electrodes of the bimorph element. The electromechanical actuator further comprises three conductive film areas provided at a first side of the bimorph element, which first side is parallel to the first direction. The three conductive film areas are electrically decoupled from each other. Furthermore, each of the three conductive film areas is connected to a respective one of the electrodes.

In a second aspect, a method for manufacturing an electromechanical actuator comprises providing of a bimorph element of an electromechanical material. The bimorph element is controllably bendable in a first direction by application of three voltage potentials to electrodes of the bimorph element. Three conductive film areas are created at a first side of the bimorph element, which first side is parallel to the first direction. The conductive film areas are created to be electrically decoupled from each other but to connect to a respective one of the electrodes.

An advantage with the present invention is that termination and/or electrical connection of internal electrodes of a bimorph electromechanical actuator can be provided more efficiently.

BRIEF DESCRIPTION OF THE DRAWINGS

The invention, together with further objects and advantages thereof may best be understood by making reference to the following description taken together with the accompanying drawings, in which.

DETAILED DESCRIPTION

Most actuator materials could be characterised as electromechanical materials, but in the present disclosure we intend materials that change their shape when an electric voltage or current is applied. Typical examples of electromechanical materials are piezoelectric, electrostrictive and antiferroelectric materials and these materials could be single crystalline as well as polycrystalline or amorphous. In the embodiments below, piezoelectric materials are assumed, which is also believed to be the most important example. However, the ideas of the present invention may also be applied to other types of electromechanical materials.

In the drawings, corresponding reference numbers are used for similar or corresponding parts.

Figure 1:
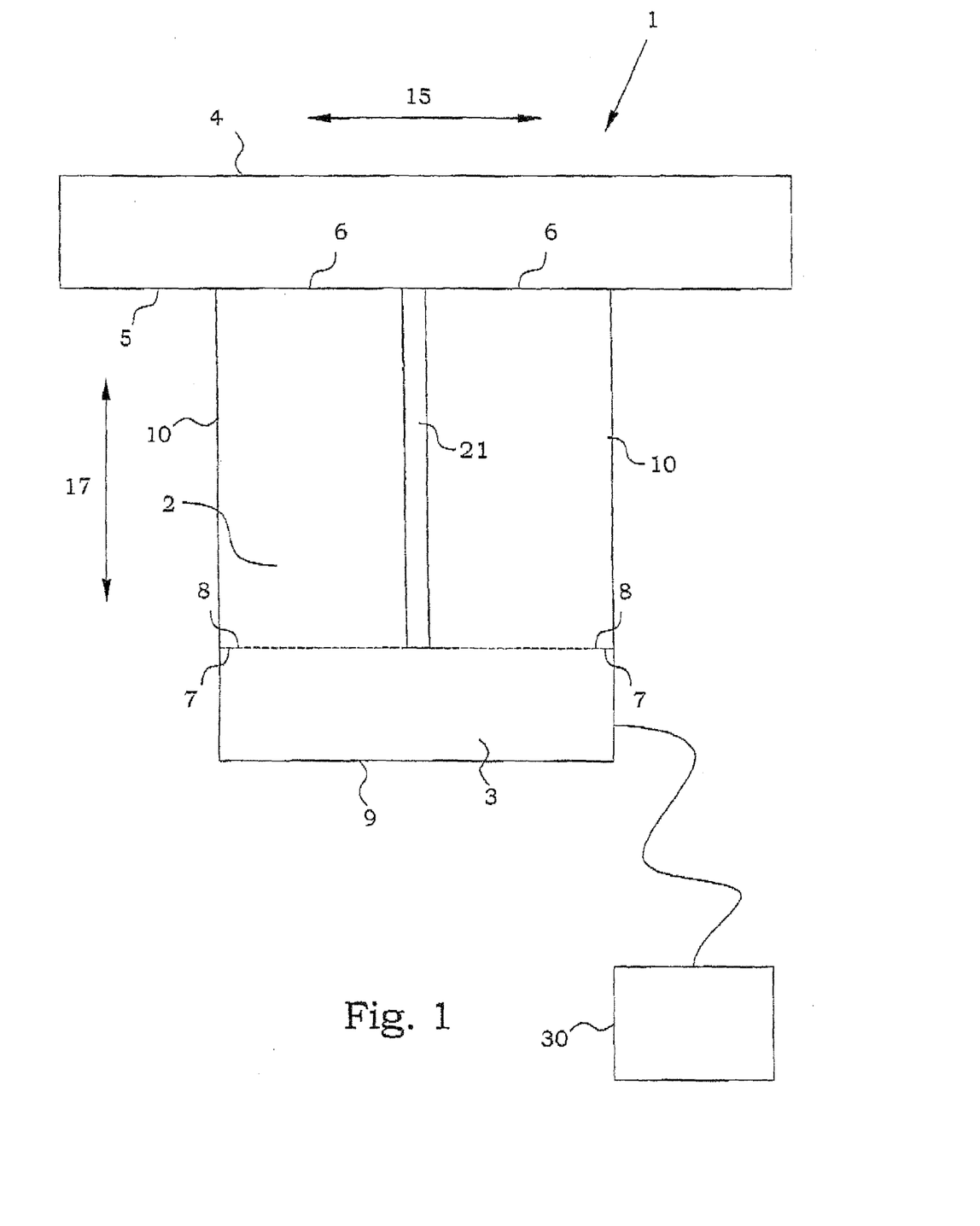
FIG. 1 is a schematic side view of an electromechanical actuator system.

FIG. 1 illustrates schematically an electromechanical motor 1 having an electromechanical actuator system 2. The electromechanical actuator system 2 comprises in this embodiment two electromechanical actuators constituted by respective electromechanical bimorph elements 10. The bimorph elements 10 extend in a generally elongated shape from a common base 3. An interaction surface 5 of a body to be moved 4, is arranged in mechanical contact with the electromechanical actuator 2. Typically, the body to be moved 4 and the electromechanical actuator 2 are kept in contact by spring means (not shown). Control electronics 30 is connected to the electromechanical actuator system 2 for supplying electrical signals that is used to activate electromechanically active material within the bimorph elements 10. The bimorph elements 10 are attached by a first end 7 to a first side 8 of the common base 3 and positioned parallel to each other one after the other in a first direction 15. The bimorph elements 10 are placed at a small distance with respect to each other, leaving at least a small slit 21 in-between. The slit 21 is typically non-filled, but may in special applications be filled with a soft material not restricting any motion of the bimorph elements 10 in any substantial degree. The bimorph elements 10 and the common base 3 are in this particular embodiment manufactured as one single integrated body. The bimorph elements 10 are arranged to provide movements of a second end 6, i.e. the actuating portion tip, along the first direction 15 and along the extension 17 of the bimorph element 10. To this end, the bimorph elements 10 are controllably bendable in the first direction 15 by application of at least three voltage potentials to electrodes of the bimorph element 10. The body to be moved 4 can thereby be given a motion in the first direction 15 relative to the electromechanical actuator system 2. The electromechanical actuator system 2 performs "steps" with its "legs" constituted by the bimorph elements 10.

Figure 2:
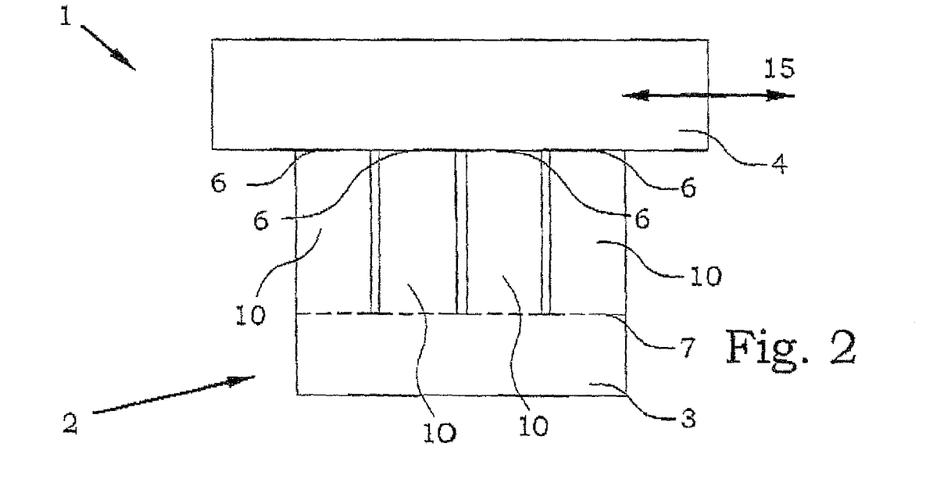
FIG. 2 is a schematic side view of another electromechanical actuator system.

The number of "legs" can be varied according to the application. In systems where additional support by external means is provided or where the inertia of the body to be moved is used for creating slip-stick motions, it may be enough with a single bimorph element. In other applications it may be beneficial to use more than two bimorph elements. FIG. 2 illustrates e.g. an embodiment using four bimorph elements. The principles of contacting according to the present invention are, however, applicable regardless of the number of bimorph elements.

A bimorph is operable if two part volumes are possible to excite independently of each other. For electromechanical materials, different voltage differences, i.e. different electrical fields, are typically provided over different parts of the bimorph. In order to achieve at least two different electrical fields, at least three independently controllable voltage potentials have to be provided. One of the voltage potentials are in such case used in common, and typically a ground potential is used for such a common potential. The two other potentials can then be varied in order to achieve the differing electrical fields. As anyone skilled in the art understands, differing electrical fields can also be provided by use of more than three voltage potentials. In such cases all electrodes in one part of the bimorph may be electrically insulated from all electrodes of the other part.

Figure 3A:
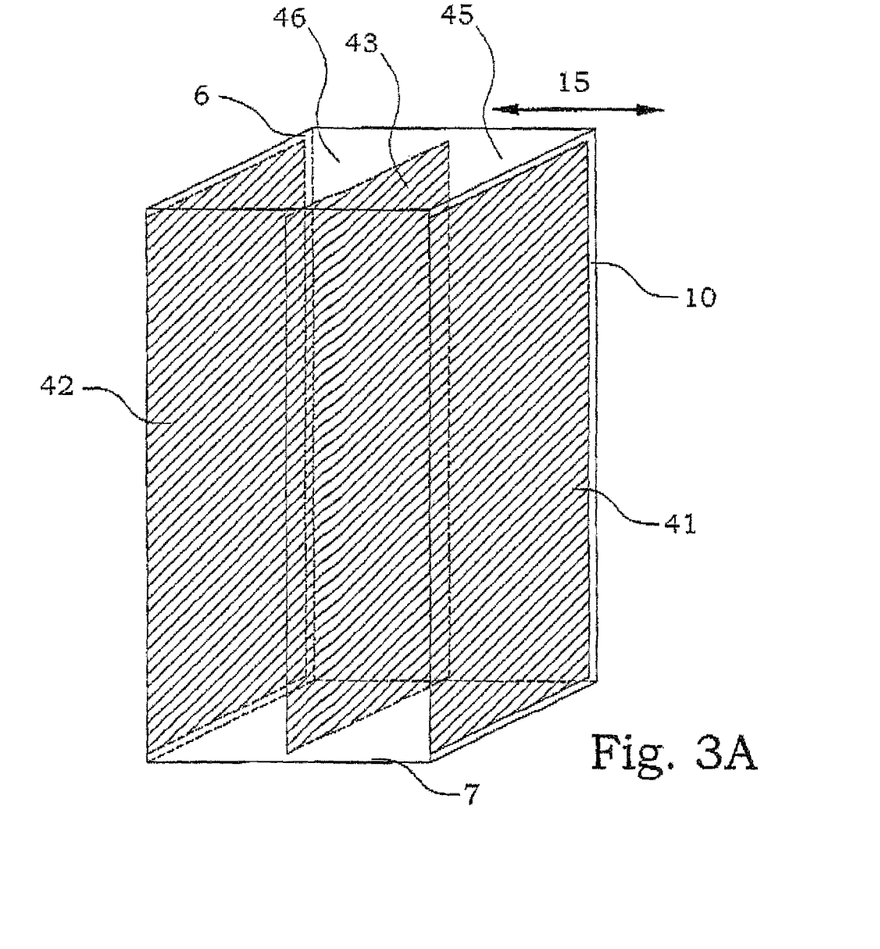
FIGS. 3A-F are schematic views of electrode arrangements in bimorph elements.
Figure 3B:
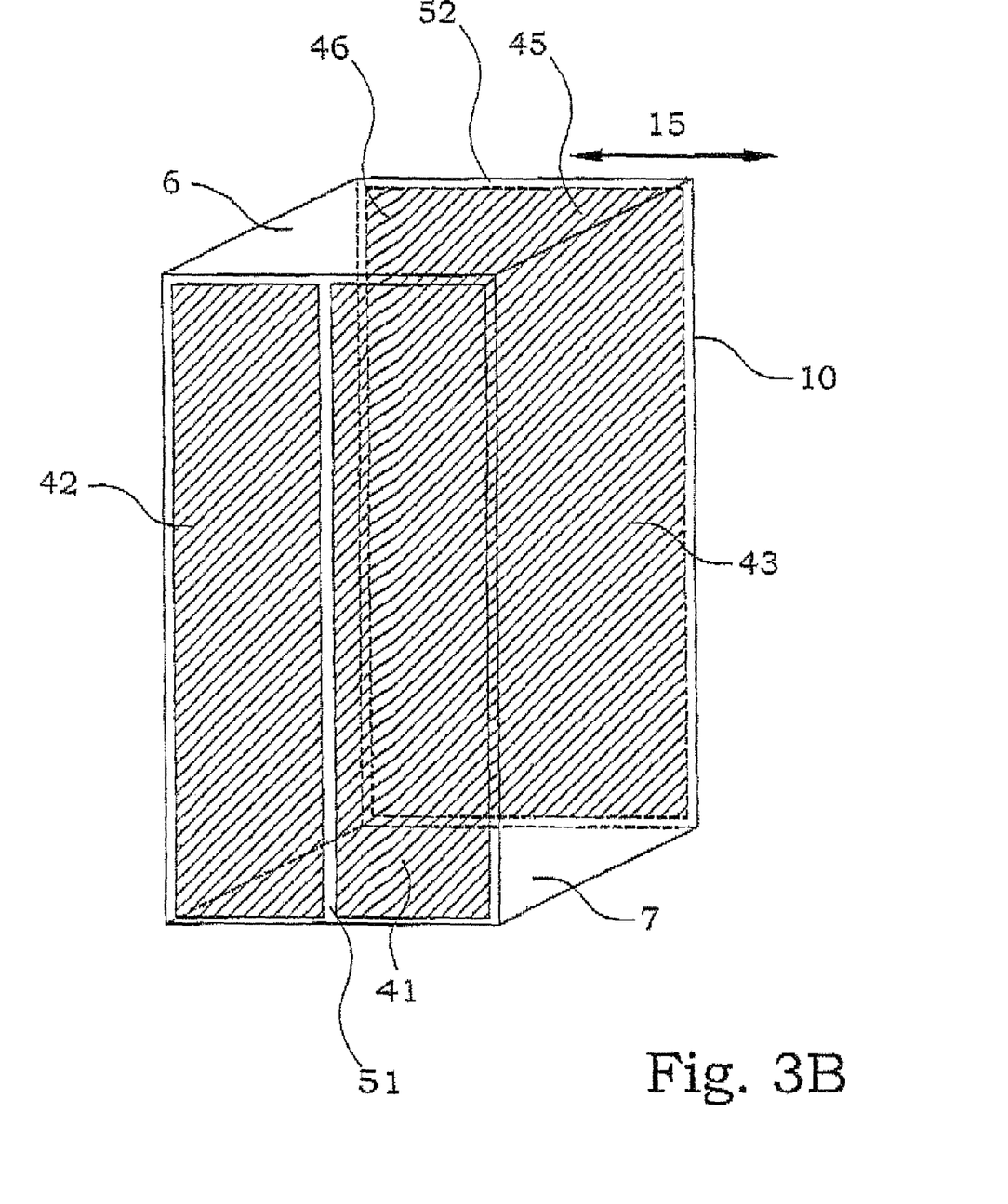
Figure 3C:
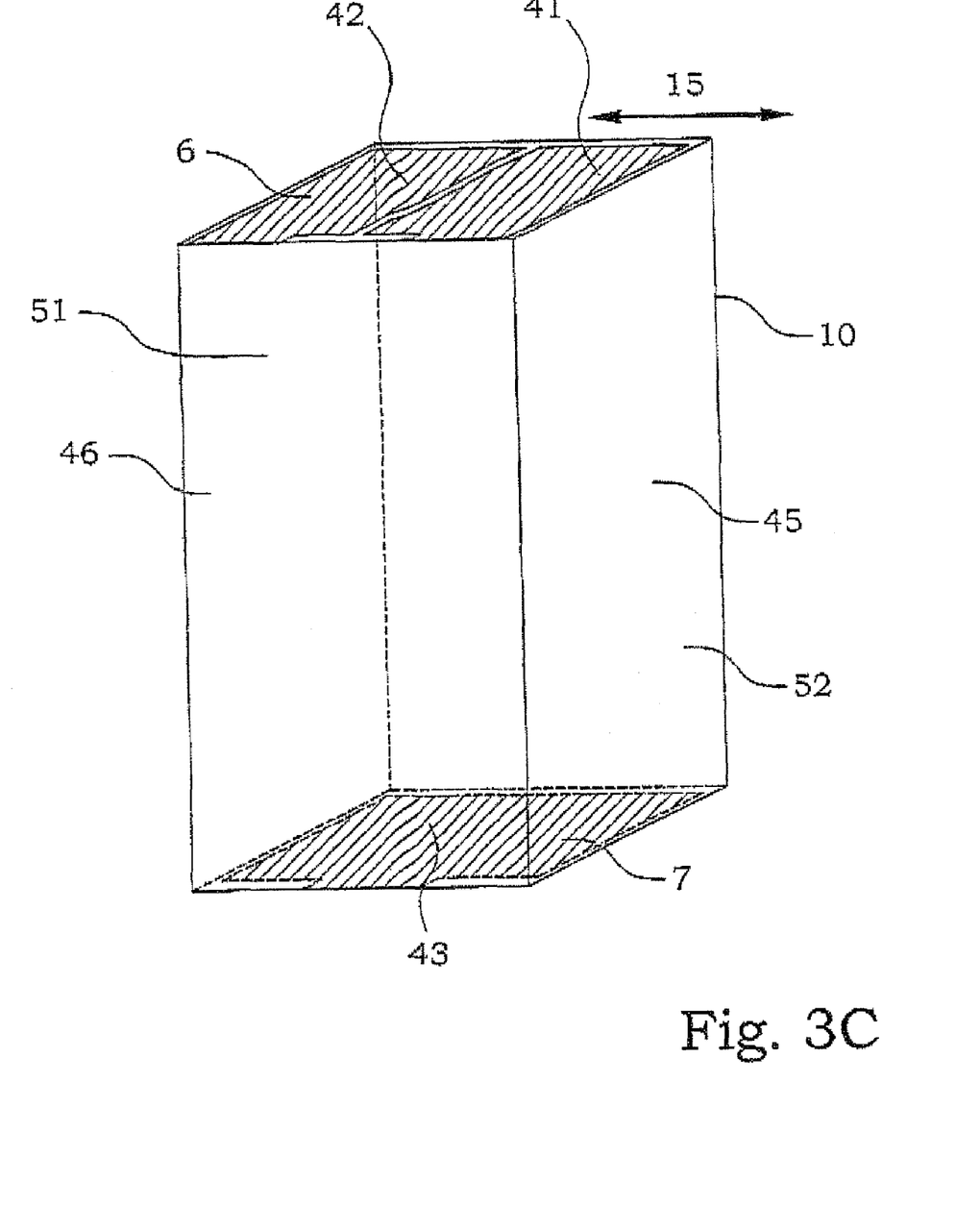

The bimorph elements can be constructed using either single layer electromechanical ceramics, having electromechanical volumes excited by electrodes provided at the side of the single layer electromechanical volumes, or multi-layer electromechanical ceramics, having a multitude of internal electrodes. The electrodes can furthermore be directed in different directions. Electrodes perpendicular to the main extension of the bimorph element make use of dimension change along an applied electrical field, whereas electrodes parallel to the main extension of the bimorph element make use of dimension change transverse to an applied electrical field. In FIGS. 3A-C, single layer bimorphs with three different electrode directions are illustrated. The bimorph elements are illustrated as if they would have been transparent, in order to reveal the electrode configuration. However, as anyone skilled in the art realizes, electromechanical materials are typically not transparent and internal electrodes or electrodes at the back side are thereby not possible to see from the outside. Electrodes are hatched in FIGS. 3A-C.

In FIG. 3A, one phase electrode 41 is provided at one side of the bimorph element 10, facing the first direction 15, another phase electrode 42 is provided at an opposite side of the bimorph element 10, also facing the first direction 15. A ground electrode 43 is provided in the middle of the bimorph element 10 parallel to the phase electrodes 41, 42. One bimorph part volume 45 is defined between electrodes 41 and 43 and another bimorph part volume 46 is defined between electrodes 42 and 43. By applying different potentials to the electrodes 41-43, of which one typically is a ground potential, individual excitations of the bimorph part volumes are achieved.

In FIG. 3B, two phase electrodes 41, 42 are provided at a side 51 of the bimorph element 10, parallel the first direction 15. The phase electrodes 41, 42 cover a respective bimorph part volume 45, 46. At an opposite side 52 of the bimorph element 10 another electrode 43 is provided over essentially the entire bimorph element 10 surface, typically a ground electrode. As before, by applying different potentials to the electrodes 41-43 individual excitation of the bimorph part volumes 45, 46 are achieved.

In FIG. 3C, two phase electrodes 41, 42 are provided at the top 6 of the bimorph element 10, facing the body to be moved 4. The phase electrodes 41, 42 cover a respective bimorph part volume 45, 46. Another electrode 43, typically a ground electrode, is provided at the bottom 7 of the bimorph element 10, covering essentially the entire bimorph element 10 surface. As before, by applying different potentials to the electrodes 41-43 individual excitation of the bimorph part volumes 45, 46 are achieved. As anyone skilled in the art, the position of the phase electrodes 41, 42 and the electrode 43 may also be interchanged.

Insulating and/or wear-resistant coatings may be provided on top of the electrodes.

Figure 3D:
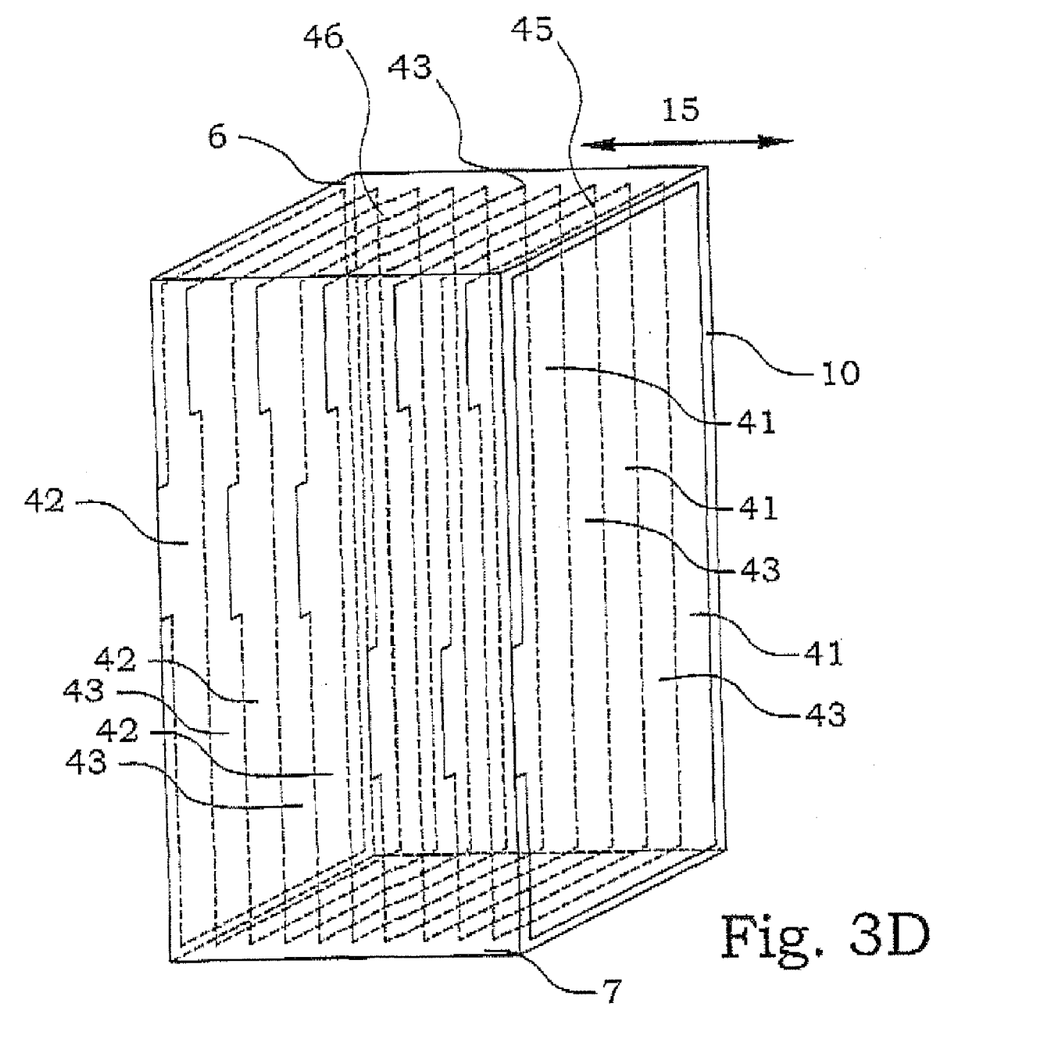
Figure 3E:
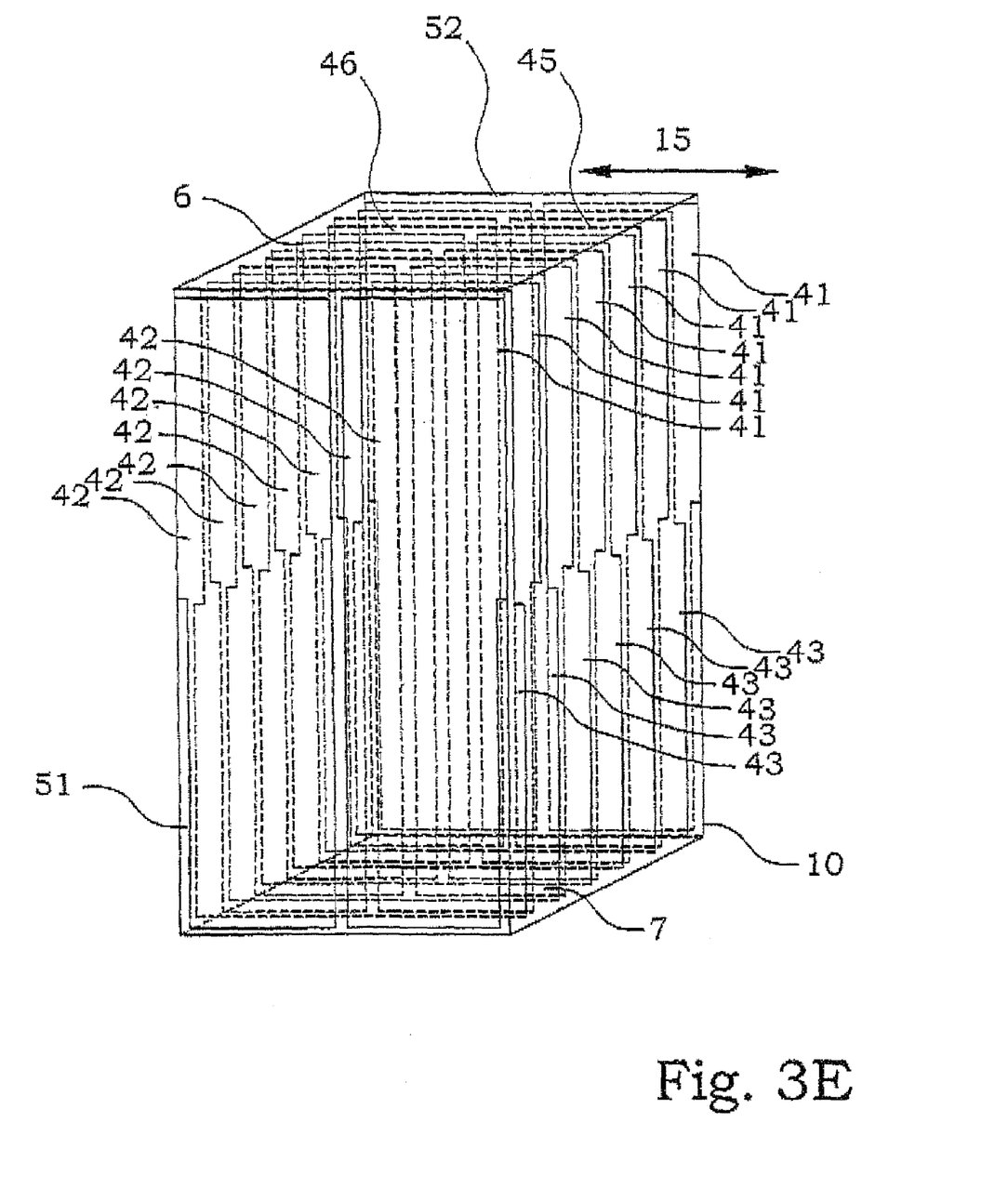
Figure 3F:
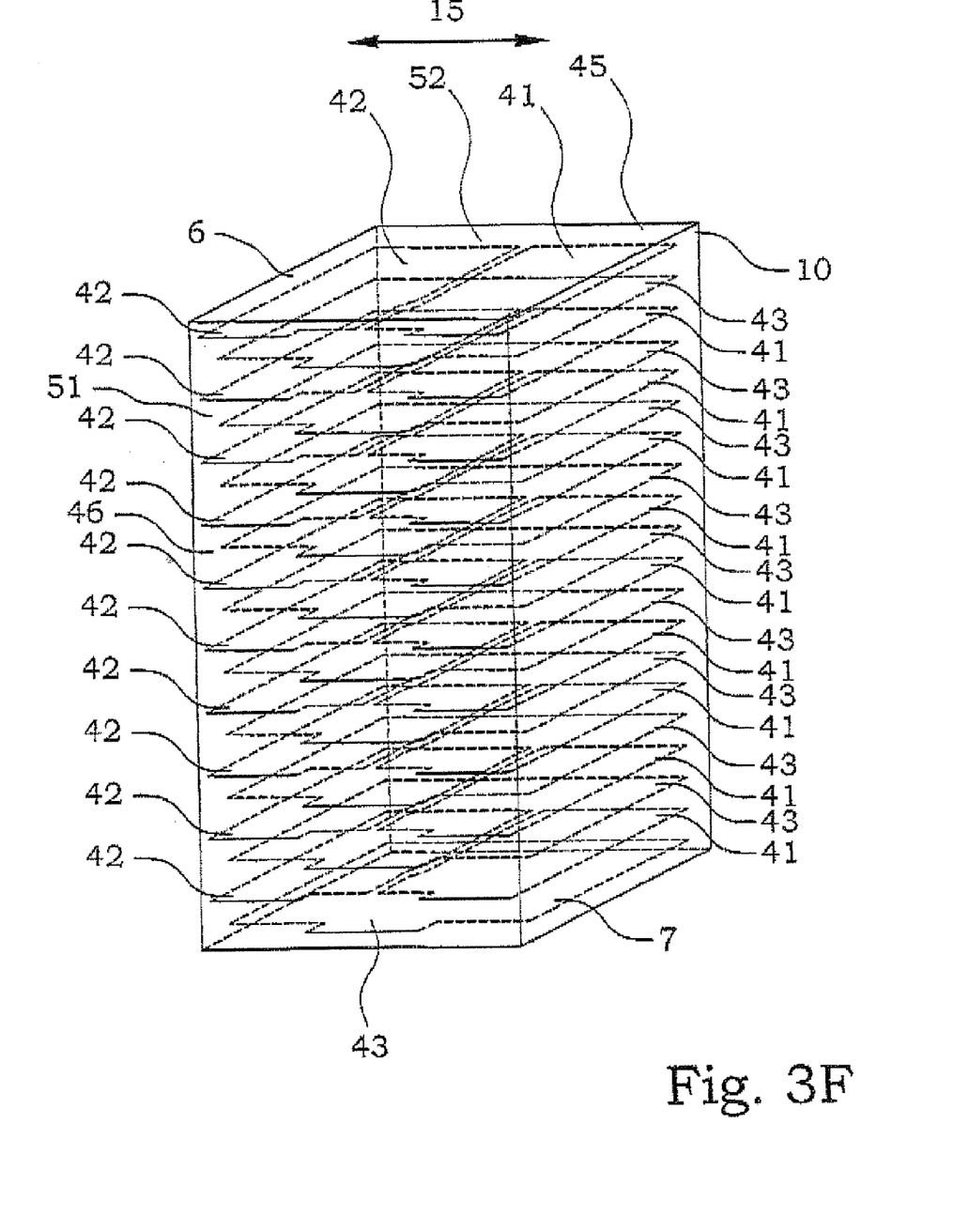

In FIGS. 3D-F, multilayer bimorphs with three different electrode directions are illustrated. For increasing the readability, electrodes are not hatched in FIGS. 3D-F. In the illustrated embodiments, only a few internal electrodes are illustrated. In real bimorph elements, the number of electrodes can be much larger. Up to 100 internal electrodes in one bimorph element is not unusual.

In FIG. 3D, multiple electrodes 41, 42, 43 are provided throughout the bimorph element 10, facing the first direction 15, thus being internal electrodes. In a typical design, in each bimorph part volumes 45, 46, the electrodes 41, 42, 43 are alternating provided with a ground potential and a phase potential. In other words, every second electrodes within each bimorph part volume 45, 46 is a ground electrode and the other are phase electrodes. The provision of three different potentials, analogue to the case in FIG. 3A, enables a bimorph action. The internal electrodes are configured in such a manner that they reach the surface of the bimorph element 10 either by themselves or via some electrical connections, which enables the provision of different potentials. The outermost electrodes may be situated at the surface of the bimorph element or may be internal electrodes.

In FIG. 3E, multiple electrodes 41, 42, 43 are provided throughout the bimorph element 10, however, here parallel to the first direction 15, also being internal electrodes. In a typical design, in each bimorph part volumes 45, 46, the electrodes 41, 42, 43 are alternating provided with a ground potential and a phase potential. In other words, every second electrodes within each bimorph part volume 45, 46 is a ground electrode and the other are phase electrodes. The provision of three different potentials, analogue to the case in FIG. 3B, enables a bimorph action. The internal electrodes are configured in such a manner that they reach the surface of the bimorph element 10 either by themselves or via some electrical connections, which enables the provision of different potentials.

In FIG. 3F, multiple electrodes 41, 42, 43 are provided throughout the bimorph element 10, however, here facing the body to be moved 4, also being internal electrodes. In a typical design, in each bimorph part volumes 45, 46, the electrodes 41, 42, 43 are alternating provided with a ground potential and a phase potential. In other words, every second electrodes within each bimorph part volume 45, 46 is a ground electrode and the other are phase electrodes. The provision of three different potentials, analogue to the case in FIG. 3C, enables a bimorph action. The internal electrodes are configured in such a manner that they reach the surface of the bimorph element 10 either by themselves or via some electrical connections, which enables the provision of different potentials.

Figure 4:
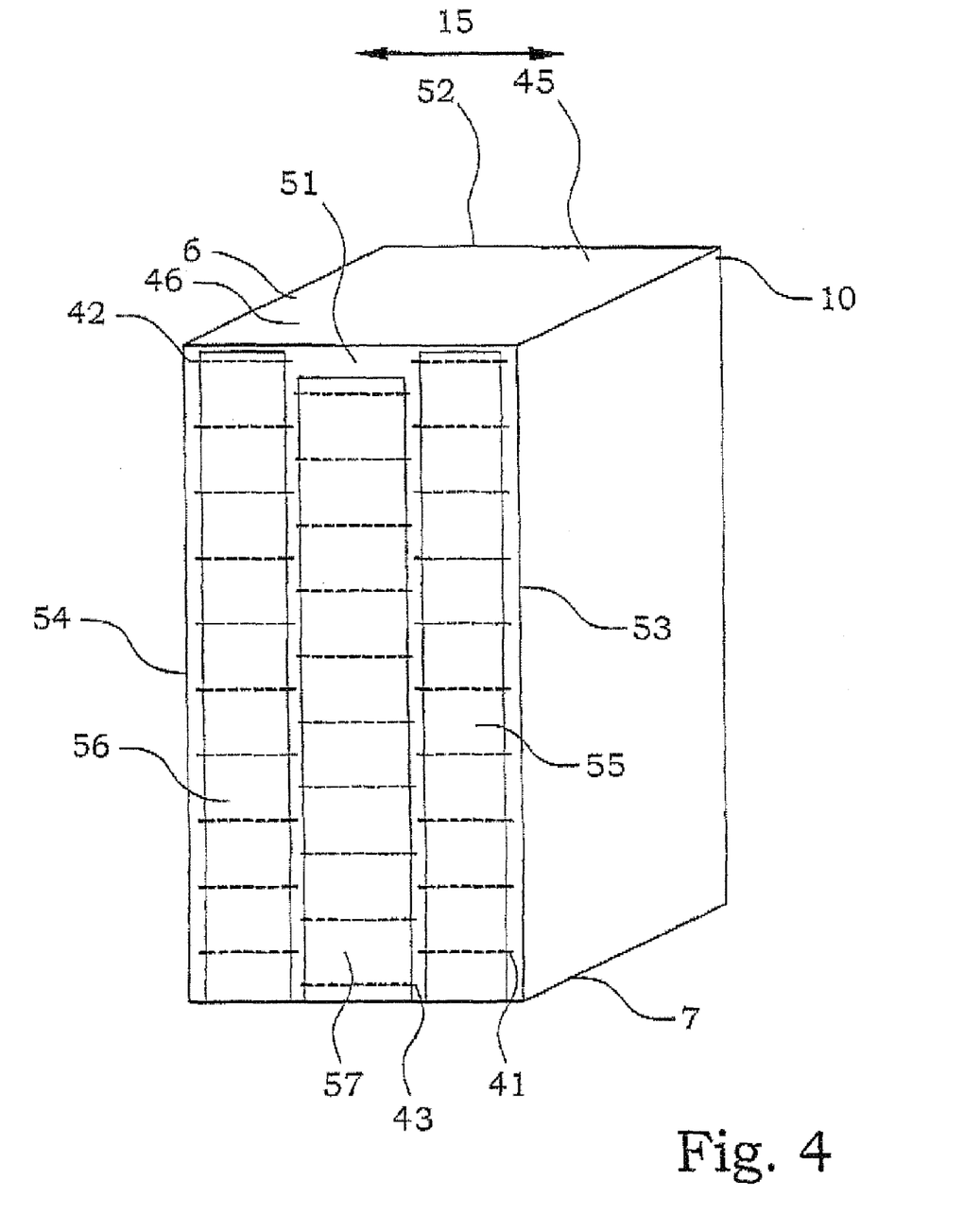
FIGS. 4 and 5 are schematic views of bimorph elements according to embodiments of the present invention.

An arrangement for connecting electrodes of an electromechanical actuator according to an embodiment of the present is illustrated in FIG. 4. The internal electrode configuration of this particular embodiment resembles the configuration illustrated in FIG. 3F. Here, the "transparency" of the bimorph element 10 is removed and the only parts of the electrodes that are illustrated are the parts brought out to the surface of the electromechanical material. Internal phase electrodes 41 of the first bimorph part volume 45 are brought out to a side 51 of the bimorph element 10 that is parallel to the first direction 15 and perpendicular to the main extension of the bimorph element 10. All internal phase electrodes 41 are brought to the surface of side 51 relatively close to an edge 53 of the side 51. Likewise, all internal phase electrodes 42 are brought to the surface of side 51 relatively close to an opposite edge 54 of the side 51. All internal electrodes 43, typically ground electrodes, are brought to the surface of side 51 relatively close to the middle of the side 51. Three conductive film areas 55, 56 and 57 are provided at the side 51 of the bimorph element 10. The three conductive film areas 55, 56 and 57 are electrically decoupled from each other. Furthermore, each of the three conductive film areas 55, 56, 57 are connected to a respective group of electrodes. More in detail, in this embodiment, the conductive film area 55 covers the area in which internal phase electrodes 41 are brought to the surface of side 51. The conductive film area 56 covers the area in which internal phase electrodes 42 are brought to the surface of side 51. The conductive film area 57 covers the area in which internal electrodes 43 are brought to the surface of side 51. In this embodiment, the three conductive film areas are thus connected to a respective multitude of electrodes. The three conductive film areas 55, 56 and 57 thereby constitute terminations of a respective group of internal electrodes.

In a corresponding arrangement using an electrode arrangement as in FIG. 3C, each conductive film area connects only to one electrode each. However, the benefits of the present invention are considered to be larger for multi-layer systems.

The configuration as seen in FIG. 4 has certain obvious advantages. One advantage is that only one side of the bimorph element 10 is necessary to provide with terminations, since all electrodes may be contacted from one and the same side. The side 52, of the bimorph element 10, opposite to the first side 51, can be kept free from terminations. The creation of terminations can thereby easily be performed in a single step without having to turn the bimorph element around or to enable access to both sides simultaneously. Likewise, the actual connection to the voltage supply can be provided at one side only. Further advantages are discussed further below.

In applications where production cost is less important than reliability, the ability to connect all electrodes from one and the same side can be used also for achieving other advantages. It is well known that dead volumes may appear in different parts of electromechanical actuators due to different electrode configurations. Such dead volumes may in turn lead to stress in the actuators during operation and may give rise to cracks in the material. If terminations are provided directly onto the actuators, also the terminations may crack. According to ideas of the present invention, all necessary voltage potentials are possible to provide using only one side of the bimorph element. By making the same arrangement also on the opposite side of the bimorph element, a redundancy in termination and connection of electrodes can easily be achieved.

It is, as mentioned above, common that an electromechanical actuator system comprise more than bimorph element, interconnected by a common base. It is possible to apply the ideas of the present invention to one or several of the bimorph elements. Furthermore, a surface of the common base may also be utilized, e.g. for providing cross-connections between conductive film areas of different bimorphs. This is particularly advantageous if the common base has a base side in level with the side of the bimorphs on which the conductive film areas are provided.

In applications with requirements for small volume actuators, space available e.g. for electrical components may be severely restricted. As mentioned further below, preferred manufacturing methods for arrangements according to the present invention includes methods that commonly axe used for e.g. providing active or passive components on a printed circuit board. Passive or active electrical components could therefore easily be provided together with the conductive film areas directly printed onto the electromechanical material. A part of e.g. the voltage signal control could thereby be provided by components created directly on the bimorph elements themselves. In such a way, losses due to resistive heating may also be reduced.

Figure 5:
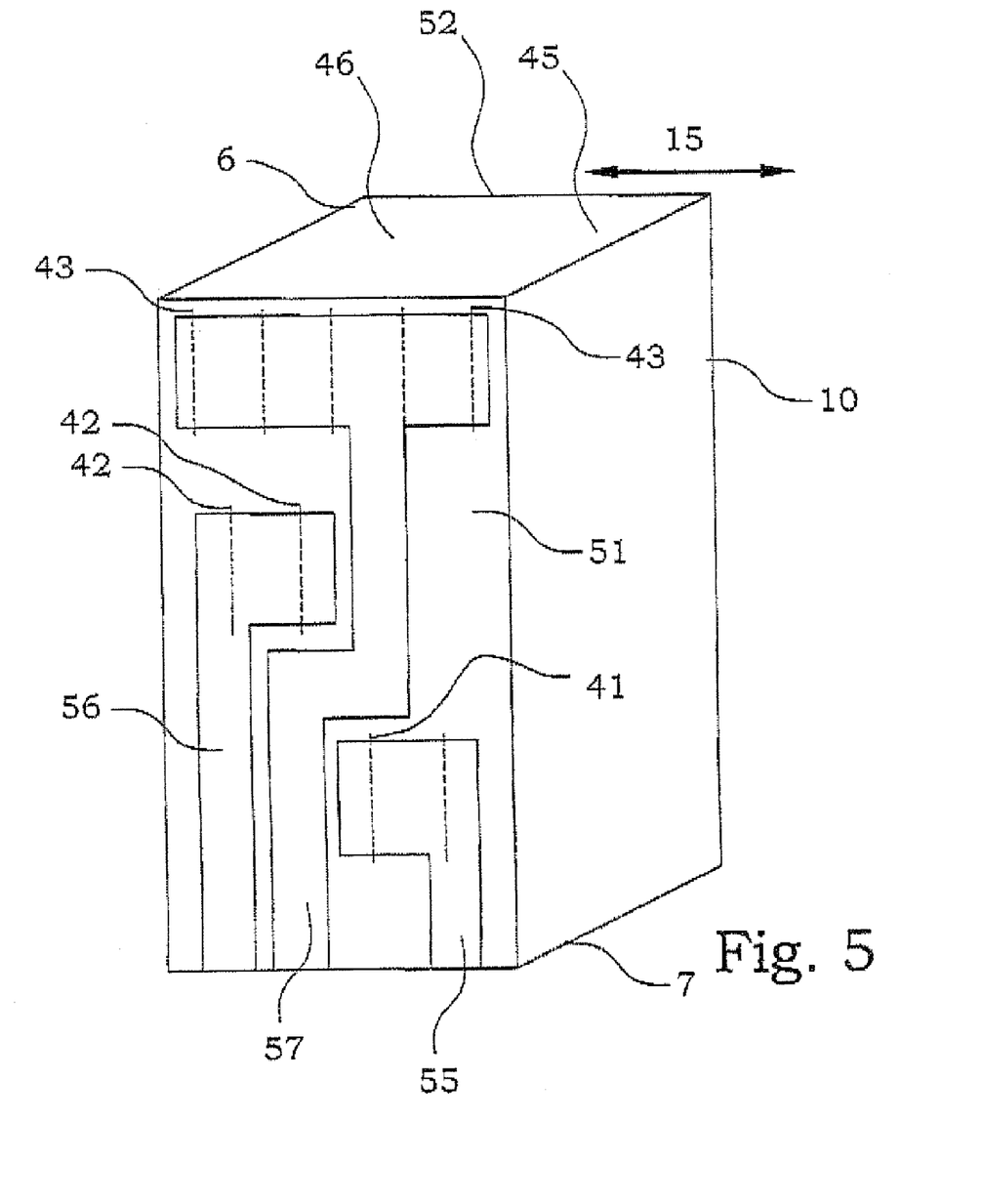

An arrangement for connecting electrodes of an electromechanical actuator according to another embodiment of the present is illustrated in FIG. 5. The internal electrode configuration of this particular embodiment resembles the configuration illustrated in FIG. 3D. Internal phase electrodes 41 of the first bimorph part volume 45 are brought out to a side 51 of the bimorph element 10 that is parallel to the first direction 15 and perpendicular to the main extension of the bimorph element 10. All internal phase electrodes 41 are brought to the surface of side 51 relatively close to the bottom 7 of the side 51. Likewise, all internal phase electrodes 42 are brought to the surface of side 51 relatively close to the middle part of the side 51. All internal electrodes 43, typically ground electrodes, are brought to the surface of side 51 relatively close to the top of the side 51. Three conductive film areas 55, 56 and 57 are provided at the side 51 of the bimorph element 10. The three conductive film areas 55, 56 and 57 are electrically decoupled from each other. Furthermore, each of the three conductive film areas 55, 56, 57 are connected to a respective group of electrodes. More in detail, in this embodiment, the conductive film area 55 covers the area in which internal phase electrodes 41 are brought to the surface of side 51. The conductive film area 56 covers the area in which internal phase electrodes 42 are brought to the surface of side 51. The conductive film area 57 covers the area in which internal electrodes 43 are brought to the surface of side 51. In this embodiment, the three conductive film areas are thus connected to a respective multitude of electrodes. The three conductive film areas 55, 56 and 57 thereby constitute terminations of a respective group of internal electrodes.

In a corresponding arrangement using an electrode arrangement as in FIG. 3A, each conductive film area connects only to one electrode each. However, the benefits of the present invention are considered to be larger for multi-layer systems.

Figure 6:
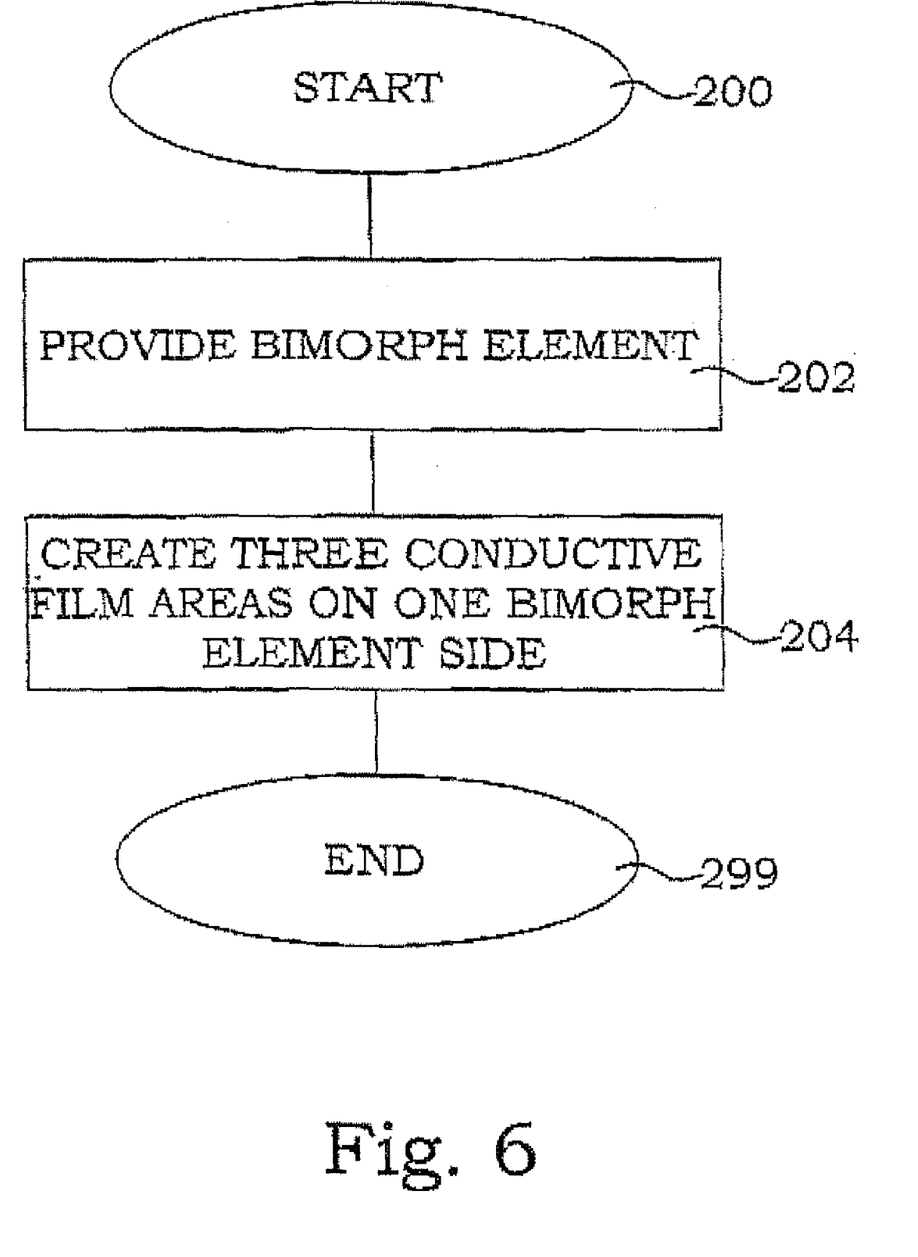
FIG. 6 is a flow diagram of steps of a manufacturing method according to an embodiment of the present invention.

FIG. 6 illustrates a flow diagram of steps of a manufacturing method according to an embodiment of the present invention. The method for manufacturing an electromechanical actuator starts in step 200. In step 202, a bimorph element is provided. The bimorph element is controllably bendable in a first direction by application of three voltage potentials to electrodes of the bimorph element. The method to manufacture the bimorph element are typically performed according to conventional methods and the details are not of any particular importance for the present invention. In step 204, three conductive film areas are created at a first side of the bimorph element. This first side is parallel to said first direction. The three conductive film areas are electrically decoupled from each other but are brought into connection to at least a respective one of the electrodes. The step 204 can be realized in different manners. The conductive film areas can be provided by most conventional thick film deposition techniques or conventional thin film techniques, such as e.g. chemical vapor deposition, physical vapor deposition, lithographic or shadow mask patterning techniques. However, in case of small size motors, the geometrical accuracy of the conductive film areas may put restrictions on which deposition techniques that can be used. Presently, it is believed that screen printing of the conductive film areas may be the preferred method step embodiment. As mentioned before, this method also has the advantage of being easily combined with the provision of active or passive electric components. The procedure ends in step 299.

The above embodiments are all embodiments having electrodes perpendicular to the side at which the conductive film areas are provided. It is indeed possible to apply the same ideas also to electrode configurations similar to FIGS. 3B and 3E. In such embodiment, an additional connection path between the electrodes and the first side of the bimorph element that is parallel to the first direction and perpendicular to the main extension of the bimorph element 10 has to be provided. However, such arrangements are presently considered as non-preferred due to necessary relatively complex additional arrangements within or at the surface of the bimorph elements.

The embodiments described above are to be understood as a few illustrative examples of the present invention. It will be understood by those skilled in the art that various modifications, combinations and changes may be made to the embodiments without departing from the scope of the present invention. In particular, different part solutions in the different embodiments can be combined in other configurations, where technically possible. The scope of the present invention is, however, defined by the appended claims.

The invention claimed is:

1. Electromechanical actuator system, comprising:
   at least two electromechanical actuators;
   said at least two electromechanical actuators being attached by a respective first end to a common base and positioned parallel to each other, one after the other in a first direction;
   said at least two electromechanical actuators having a respective actuating portion at a respective second end, said second end being opposite to said first end;
   each of said at least two electromechanical actuators comprising:
   a bimorph element of an electromechanical material controllably bendable in said first direction by application of three voltage potentials to a multitude of electrodes of said bimorph element; and
   three conductive film areas, electrically decoupled from each other, provided at a first side of said bimorph element parallel to said first direction;
   said multitude of electrodes being perpendicular to said first side; and
   each of said three conductive film areas being connected to a respective multitude of said electrode.

2. Electromechanical actuator system according to claim 1, wherein a common base has a base side in level with said first side of said bimorph elements, said base side having cross-connections between conductive film areas of different bimorph elements.

3. Electromechanical actuator system according to claim 1, wherein one of said three voltage potentials is ground potential.

4. Electromechanical actuator system according to claim 1, wherein said three conductive film areas constitute respective terminations of said multitude of electrodes of said bimorph element intended to be excited by a same respective voltage potential.

5. Electromechanical actuator system according to claim 1, wherein a second side of said bimorph element, opposite to said first side, is free from terminations.

6. Electromechanical actuator system according to claim 1, wherein said three conductive film areas are screen printed on said bimorph element.

7. Electromechanical actuator system according to claim 1, wherein at least one of said three conductive film areas on said bimorph element are further provided with passive or active electric components.

* * * * *